United States Patent [19]
Lipschutz et al.

[11] 4,442,450
[45] Apr. 10, 1984

[54] COOLING ELEMENT FOR SOLDER BONDED SEMICONDUCTOR DEVICES

[75] Inventors: Lewis D. Lipschutz, Poughkeepsie, N.Y.; Ralph E. Meagher, Vicksburg, Mich.; Frank P. Presti, Wappingers Falls, N.Y.

[73] Assignee: International Business Machines Corporation, Armonk, N.Y.

[21] Appl. No.: 249,262

[22] Filed: Mar. 30, 1981

[51] Int. Cl.[3] .................. H01L 23/02; H02B 1/00; H05K 7/20; F28F 7/00
[52] U.S. Cl. .......................... 357/81; 357/79; 165/80 A; 174/16 HS; 361/389
[58] Field of Search ............ 357/79, 81, 70, 69; 165/80 A, 185; 174/16 HS; 361/386, 387, 389

[56] References Cited
U.S. PATENT DOCUMENTS

| 3,195,628 | 7/1965 | McAdam | 165/80 B |
| 3,896,544 | 7/1975 | Fosnough | 357/79 |
| 3,996,604 | 12/1976 | Kimura et al. | 357/82 |
| 4,093,971 | 6/1978 | Chu et al. | 357/81 |
| 4,203,646 | 5/1980 | Desso et al. | 357/79 |
| 4,234,666 | 11/1980 | Gursky | 357/69 X |
| 4,263,965 | 4/1981 | Monsuria et al. | 361/386 X |

OTHER PUBLICATIONS
IBM TDB vol. 21, No. 3, Aug. 1978, p. 1141.
IBM TDB vol. 20, No. 12, May 1978, p. 5203.
IBM TDB vol. 13, No. 5, Oct. 1970, p. 1060.
IBM TDB vol. 20, No. 5, Oct. 1977, p. 1968.
Dombroski et al., "Thermal Conduction Module," IBM Technical Disclosure Bulletin, vol. 20, No. 6, Nov. 1977.
"Semiconductor Module with Improved Air Cooling" E. E. Zirnis IBM Technical Disclosure Bulletin, vol. 20, No. 5, Oct. 1977, p. 1768.

Primary Examiner—Andrew J. James
Assistant Examiner—Seth M. Nehrbass
Attorney, Agent, or Firm—Wolmar J. Stoffel

[57] ABSTRACT

An improved electronic package having a support substrate, at least one electronic device mounted on the substrate, a cover mounted on the substrate disposed over said device and having a surface in spaced proximity to the device, the improvement being:
 a thermal bridge for conducting heat from the device to the cover which includes a relatively thick metal sheet provided with cuts that define at least one tab element,
 grooves in the tab element that make it bendable,
 and a spring means to selectively urge the tab element into contact with the device.

7 Claims, 5 Drawing Figures

COOLING ELEMENT FOR SOLDER BONDED SEMICONDUCTOR DEVICES

DESCRIPTION

1. Technical Field

This invention relates to techniques and structure for the dissipation of thermal energy generated by semiconductor devices. More particularly, the present invention relates to a system for cooling single chip or multi-chip integrated circuit assemblies where the devices are mounted on a substrate with solder bonds, and a cap is mounted in close proximity to the backsides of the devices.

The high circuit densities in modern integrated circuit semiconductor devices require that the heat generated by their operation be efficiently removed in order to maintain the temperature of the devices within limits that will keep the operating parameters of the devices within predetermined ranges, and also prevent destruction of the device by overheating. The problems of heat removal are increased when the device is connected to the supporting substrate with solder terminals that electrically connect the device to appropriate terminals on the substrate. In such solder-bonded devices, the heat transfer that can be accomplished through the solder bonds is limited, as compared to back bonded devices.

Cooling of semiconductor devices can be achieved by immersing the devices in a suitable liquid coolant. However, these cooling techniques can result in corrosion of the device and substrate metallurgy, and also present rework problems. Cooling can also be achieved by providing a conducting link of material between the device and the cap or cold plate.

This invention is an improved structure for conduction cooling semiconductor devices solder-bonded to a substrate where the heat is removed from the back side of the device to a cap or cold plate.

2. Background Art

The following prior art references relate to various structures for removing heat from a solder bonded semiconductor device. U.S. Pat. Nos. 3,741,292 and 3,851,221 both disclose a package containing a low boiling point dielectric fluid surrounding a plurality of semiconductor devices. U.S. Pat. No. 3,993,123 discloses a semiconductor package in which moveable heat conductive pistons are placed in contact with the back sides of solder bonded semiconductor devices to conduct the heat away from the devices to a cooling plate. U.S. Pat. Nos. 4,034,468 and 4,081,825 both disclose semiconductor packages wherein a low melting point solder is provided in contact with the back side of a solder bonded chip and with the module cap to remove heat from the device. U.S. Pat. No. 4,092,697 discloses a semiconductor package wherein a formable pillow filled with a thermal liquid material is disposed between the back side of a semiconductor device and the cap and serves as a heat conductive bridge. U.S. Pat. No. 4,156,458 discloses a cooling arrangement including a flexible heat conductive metallic foil bundle extending between the back side of a device and a heat sink. IBM Technical Disclosure Bulletin Vol. 21, No. 3, August 1978, p. 1141 disclosed a thermal shunt element disposed between a solder bonded semiconductor device and a module cap comprised of a rectangular center portion and a pair of divergent wings that contact the cap. IBM TDB Vol. 20, No. 6, November 1977, p. 2214, and U.S. Pat. No. 4,146,458 issued May 29, 1979, disclose a plurality of preformed sheets of aluminum foil nested together and disposed between solder bonded semiconductor devices and a housing to remove heat from the devices. IBM TDB Vol. 20, No. 8, January 1978 p. 3223 discloses a semiconductor package wherein the solder bonded semiconductor device is bonded on the back side to a cap provided with corrugations which allow stress relief.

DISCLOSURE OF INVENTION

In accordance with the present invention, we provide a device cooling structure in a semiconductor package having a support substrate, at least one integrated circuit semiconductor device having terminals solder bonded to the metallurgy on the top surface of the substrate, and a cover for the substrate positioned over the devices in space relation, the improvement being a thermal bridge element for providing heat conduction from the device to the cover, the bridge element being a relatively thick metal sheet provided with cuts that define at least one tab with the tab located over the semiconductor device, transverse grooves in the tab that make the tab bendable, and a spring means to selectively force the tab into contact with the back side of the device.

BRIEF DESCRIPTION OF THE DRAWINGS

The details of our invention will be described in connection with the accompanying drawings in which.

BEST MODE FOR CARRYING OUT THE INVENTION

Thermally conductive elements and assemblies for transferring heat from a device to a cap or heatsink in a semiconductor package should satisfy a number of requirements. The semiconductor devices mounted on a substrate by solder bonds occasionally are slightly tilted relative to the opposed surface of the cap or heatsink, which complicates the establishing of a large area contact between the conductive element and the semiconductor device. Large area contact is necessary for low thermal resistance. While thermal grease can alleviate the condition, its use is frequently undesirable because of contamination and reworking of the package considerations. The semiconductor devices are also relatively fragile. Therefore, another requirement is that the force exerted on the device by any thermally conductive element must be small, normally in the range of 10 to 200 grams weight. In addition, the mass of the thermally conductive element must be low to avoid breaking or fracturing the device when the package is subjected to shock and inertial forces. Another requirement is that the thermal structure should be easy to assemble and manufacture to reduce cost, and also be easy to disassemble when reworking of the package is necessary.

The thermal assembly of the invention is adapted to meet aforediscussed requirements, thereby contributing to the semiconductor package technology by making possible a more efficient, easier to cool, less expensive to manufacture and repairable semiconductor package.

Figure 1:
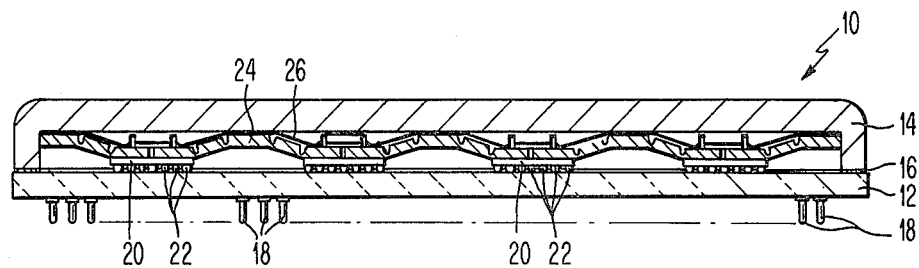
FIG. 1 is a cross-sectional view of a semiconductor package illustrating the relationship of the thermal bridge i.e., the heat conduction element of the invention with the semiconductor devices and the cap.

Referring now to FIG. 1, there is depicted a typical semiconductor package 10 having a substrate 12, and a cap 14, secured to substrate 12 by a suitable seal 16. Substrate 12 can be formed of any dielectric material and contain suitable circuitry for interconnecting pins 18 to pads on the top surface of the substrate and for interconnecting devices 20 bonded to the substrate with solder bonds 22. Substrate 12 can be formed of inorganic resins, ceramic, or any suitable dielectric material. Substrate 12 can be provided with one or more metallurgy pads on the surface for interconnecting devices 20 and making connections to pins 18. Alternately, the substrate 12 can be of a multi-layer ceramic construction in which the substrate is made up of a plurality of layers of ceramic having via holes filled with conductive metal paste and surface metallurgy layers forming an interconnected circuit network. The heat generated in devices 20 during operation is partially conducted away from the devices through solder connections 22 to substrate 12 which acts as a heatsink. However, it is usually necessary to conduct the major portion of the heat energy generated in devices 20 from the top side of devices 20 to the cap 14 which can be provided with fins or a heatsink (not shown).

Our invention is a thermal heat conduction assembly consisting of a thermal bridge element 24 in combination with a biasing spring 26. Both elements 24 and 26 are preferably fabricated to a size which fits into the cap 14, as more clearly shown in FIG. 1.

Figure 2:
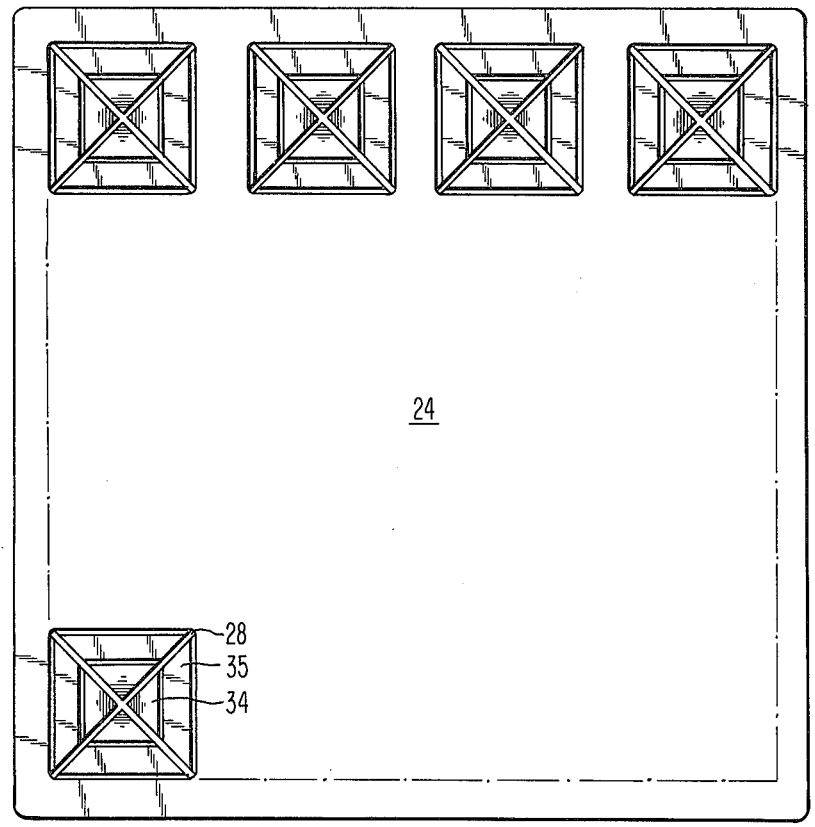
FIG. 2 is a top view of the heat conduction element of the invention.
Figure 3:
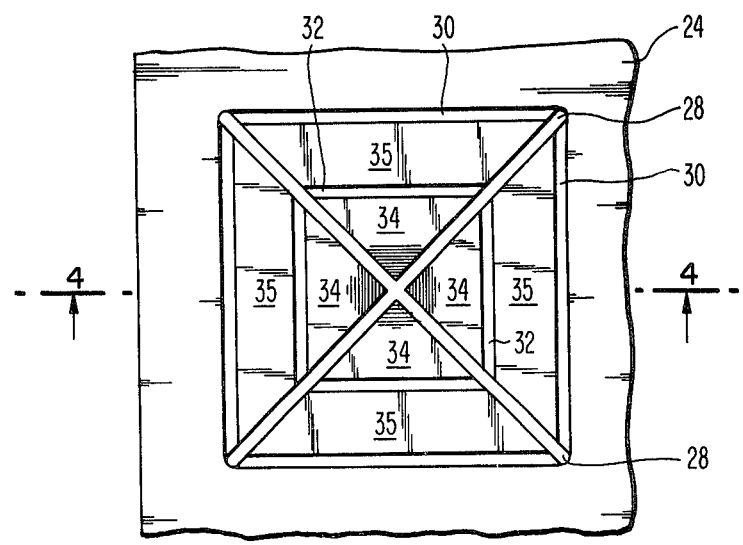
FIG. 3 is an enlarged view of one unit of the heat conduction element.
Figure 4:
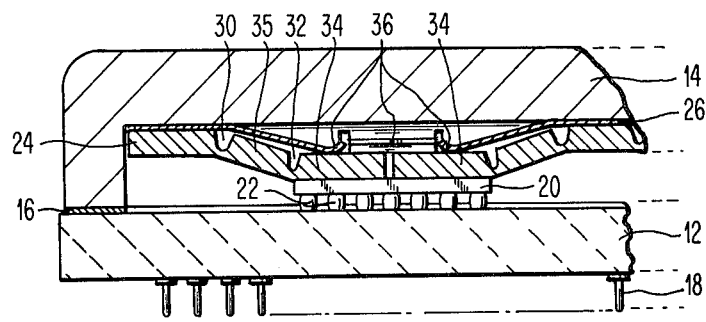
FIG. 4 is a sectional view taken on line 4—4, FIG. 3, illustrating the relationship of the bridge element and the device.
Figure 5:
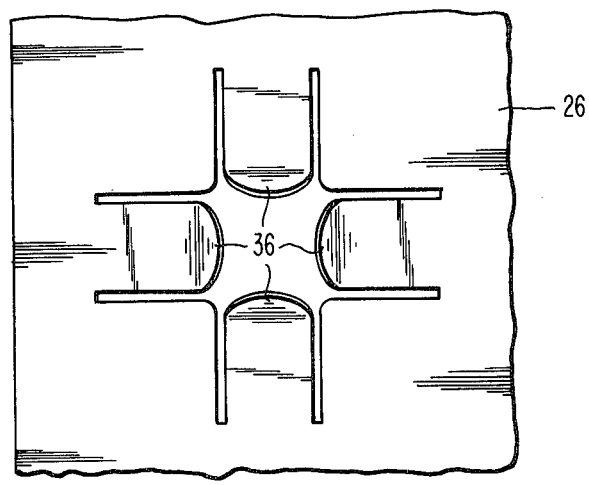
FIG. 5 is an enlarged view of one unit of the spring means used for urging the tabs of the bridge element into contact with the device.

Referring now to FIGS. 2, 3 and 4, the details of the thermal bridge element will become apparent. As indicated in FIGS. 2 and 3, a plurality of groove and cut patterns are formed in a sheet of material forming element 24. The cut and groove configurations are located in element 24 over each of the devices 20 mounted on substrate 12. Each cut and groove configuration consists of a cut 28 having a general X-shaped configuration which extends completely through element 24. Preferably, the center of the X-shaped cut 28 is centered over the device 20. A first groove 30 having a rectangular or square configuration interconnects the ends of slot 28. Groove 30 is relatively narrow and extends from 50 to 98 percent of the thickness of element 24. A second groove 32 is provided which is spaced inwardly from groove 30. Preferably, the groove 32 defines the top surface area of device 20. By providing grooves 30 and 32, the elements 34 and 35, which are formed in a sheet of material having good heat conducting qualities, can be bent with very little force. The grooves 30 and 32 essentially form hinges allowing the extending portions 34 to be bent downwardly in contact with device 20 as illustrated in FIG. 4. The heat conducting characteristics of sheet element 24 are not materially reduced since the portion in the bottom of grooves 30 and 32 is relatively short. Thus, the hinges 30 and 32 permit using a relatively heavy, thick material for conducting heat from the device to the cap 14 which would ordinarily not be useable since it would be too rigid and therefore exert a damaging force on the device 20. As illustrated in FIG. 4, the tabs 34 are pressed downwardly by fingers 36 of the overlying spring element 26. The slot configuration illustrated in FIG. 5 depicts the preferred method of forming fingers 36 in element 26. As illustrated in FIG. 4, fingers 36 are pre-bent prior to assembly to assure that the hinged sections of tabs 34 of element 24 will contact device 20 when the elements 24 and 26 are in contact with the upper surface of cap 14. This assembly assures that the force applied to the devices is not so great as to cause breakage or fracture of the devices.

The material of element 24 can be any suitable material having good heat conducting qualities. The preferred materials are copper and aluminum. The cuts 28 and grooves 30 and 32 can be either machined in element 24 or etched using masking and etching techniques. The thickness of element 24 can be any suitable thickness, more preferably in the range of 0.005 inch to 0.050 inch. Spring element 26 can also be any suitable material capable of providing the spring-like actions of fingers 36. The preferred material is a beryllium copper alloy. Steel and zirconium copper alloy can also be used. As indicated in FIG. 4, the thickness of spring element 26 is materially less than element 24. The thickness of spring element 26 is preferably in the range of 0.001 inch to 0.005 inch, depending somewhat on the nature of the material.

While the invention has been particularly shown and described with reference to the preferred embodiment thereof, it will be understood by those skilled in the art that various changes in form and detail may be made therein without departing from the spirit and scope of the invention.

We claim:

1. In an electronic package having a support substrate, at least one electronic device mounted on the substrate, a cover mounted on said substrate disposed over said device having a surface in spaced proximity to said device, the improvement comprising,
    a thermal bridge for conducting heat from said device to said cover comprising a relatively thick metal sheet with a thickness in the range of 0.005 to 0.050 inches and provided with cuts that define at least one tab element,
    at least two grooves in said tab element that make it bendable, with a portion positionable in a plane that is parallel and laterally displaced from the plane of said sheet, said grooves extending through 50 to 98 percent of the thickness of said metal sheet,
    a leaf-like spring element positioned in overlying relation to said metal sheet to selectively urge said tab element into contact with said device.

2. The package of claim 1 wherein a plurality of devices are mounted on said substrate, and said metal sheet is provided with a like number of sets of tab elements.

3. The package of claim 2 wherein said metal sheet has an X-shaped slot over each device that defines four tabs that contact each device, and said spring means has four corresponding fingers that urge said tabs into contact with said device.

4. The package of claim 1 wherein said spring element is a flat sheet of material provided with at least one finger for urging said tab element into contact with said device.

5. The package of claim 4 wherein said at least one tab element is formed by an X-shaped cut defining four inwardly directed tabs.

6. The package of claim 2 wherein said relatively thick metal sheet is copper.

7. The package of claim 5 wherein said flat sheet of material has four bent fingers overlying each of said four tabs of said relatively thick metal sheet.

* * * * *